US006974914B2

United States Patent
Taylor et al.

(10) Patent No.: US 6,974,914 B2
(45) Date of Patent: Dec. 13, 2005

(54) RETENTION SYSTEM FOR RETAINING ASSEMBLIES WITHIN AN ELECTRIC DEVICE CHASSIS

(75) Inventors: Tillman Frazier Taylor, Fort Collins, CO (US); David William Mayer, Fort Collins, CO (US); Arlen Lee Roesner, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 168 days.

(21) Appl. No.: 10/324,599

(22) Filed: Dec. 19, 2002

(65) Prior Publication Data

US 2004/0120125 A1 Jun. 24, 2004

(51) Int. Cl.[7] .................................................. H05K 1/00
(52) U.S. Cl. ...................... 174/250; 361/807; 361/810; 361/755; 174/138 E; 211/41.17
(58) Field of Search ................................. 361/790, 755, 361/759, 740, 732, 726, 747, 754, 798, 807, 810; 174/138 E, 250, 138 G; 211/41.17; 439/157, 377, 325, 327

(56) References Cited

U.S. PATENT DOCUMENTS

| 3,714,513 | A |   | 1/1973  | Morconi         |         |
|-----------|---|---|---------|-----------------|---------|
| 4,006,955 | A |   | 2/1977  | Johnson         |         |
| 4,323,161 | A |   | 4/1982  | Marconi         |         |
| 4,478,331 | A | * | 10/1984 | Ruin            | 206/707 |
| 4,847,588 | A |   | 7/1989  | Doutrich        |         |
| 4,900,276 | A |   | 2/1990  | Doutrich        |         |
| 5,171,165 | A |   | 12/1992 | Hwang           |         |
| 5,398,156 | A |   | 3/1995  | Steffes et al.  |         |
| 5,784,263 | A |   | 7/1998  | Nelson          |         |
| 6,278,614 | B1| * | 8/2001  | Beaman et al.   | 361/752 |
| 6,422,116 | B1| * | 7/2002  | Kenyon et al.   | 83/477.2|

* cited by examiner

Primary Examiner—Kamand Cuneo
Assistant Examiner—Hung S. Bui (57) ABSTRACT

A retention system is provided for a printed circuit assembly. The retention system comprises a structural wall having a wall edge that defines a slot. A printed circuit assembly is disposed proximate the slot, and a retainer plug is slidably disposed in the slot, such that appropriate movement of the retainer plug locks the retainer plug at a desired location along the slot to limit movement of the printed circuit card.

40 Claims, 7 Drawing Sheets

RETENTION SYSTEM FOR RETAINING ASSEMBLIES WITHIN AN ELECTRIC DEVICE CHASSIS

BACKGROUND OF THE INVENTION

In a variety of electronic devices, such as computer-based devices, certain assemblies are plugged into or otherwise engaged with corresponding connectors. For example, in a computer, a variety of printed circuit card assemblies are plugged into corresponding card edge connectors. In such systems, the printed circuit card assembly may be selectively removed or replaced by pulling the assembly from the corresponding card edge connector. Although removability is often desirable, operation and movement of the overall system can create vibration or jarring that leads to inadvertent disconnection of the assembly from its corresponding connector. The disconnection can lead to inoperability or impaired operation of the overall system.

SUMMARY

In one embodiment of the present invention, a retention system is provided for a printed circuit assembly. The retention system comprises a structural wall having a wall edge that defines a slot. A printed circuit card is disposed proximate the slot, and a retainer plug is slidably disposed in the slot, such that rotation of the retainer plug locks the retainer plug at a desired location along the slot to limit movement of the printed circuit card.

Another embodiment relates to a system comprising a computer. The computer has a wall with a card edge connector adjacent the wall. A printed circuit card is coupled to the card edge connector and a retainer is slidably mounted for movement along the wall. The retainer may be slid into engagement with the printed circuit card and selectively locked to retain the printed circuit card in engagement with the card edge connector.

Another embodiment relates to a device for use in securing an assembly within an electronic device. The device for use in securing comprises a retainer having an axis. The retainer further comprises an end cap, a midsection, a cam region and an assembly engagement end. The midsection has at least one radial extension, and the cam region is disposed intermediate the end cap and the midsection. The assembly engagement end is disposed on an axially opposite side of the midsection from the cam region.

Another embodiment relates to a method of retaining at least one printed circuit card within a chassis. The method comprises deploying a retainer plug in a wall slot adjacent a printed circuit card, moving the retainer plug along the wall slot until it is proximate an edge of the printed circuit card, and creating an interference fit between the retainer plug and a pair of edges defining the wall slot.

BRIEF DESCRIPTION OF THE DRAWINGS

Certain exemplary embodiments of the invention will hereafter be described with reference to the accompanying drawings, wherein like reference numerals denote like elements, and.

DETAILED DESCRIPTION

Figure 1:
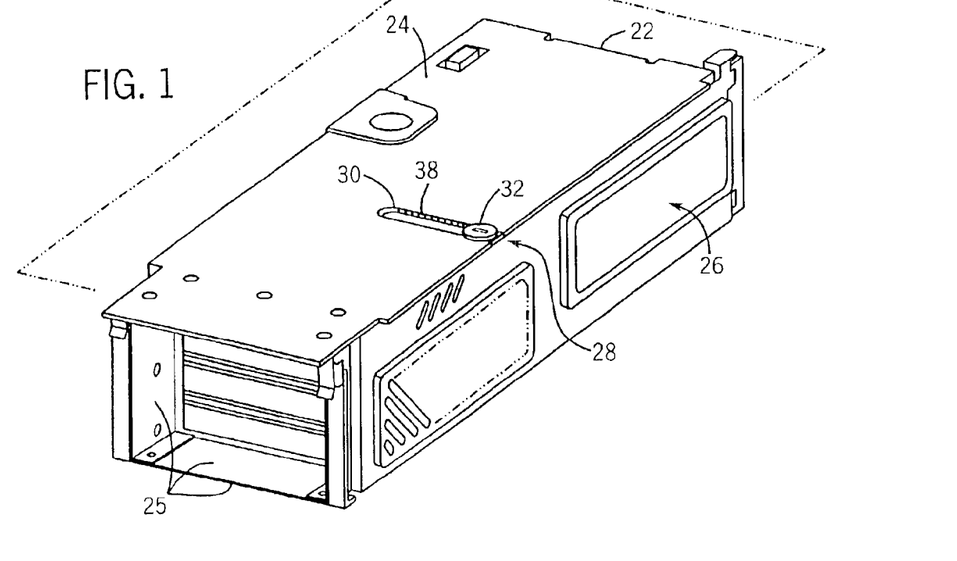
FIG. 1 is a perspective view of an embodiment of an electronic device having an embodiment of a retention mechanism.

Referring generally to FIG. 1, an electronic device 20 is illustrated according to one embodiment of the present invention. Electronic device 20 may comprise a variety of devices, such as computer-based devices. Furthermore, electronic device 20 comprises a chassis 22 having at least one structural wall, such as structural wall 24.

Figure 2:
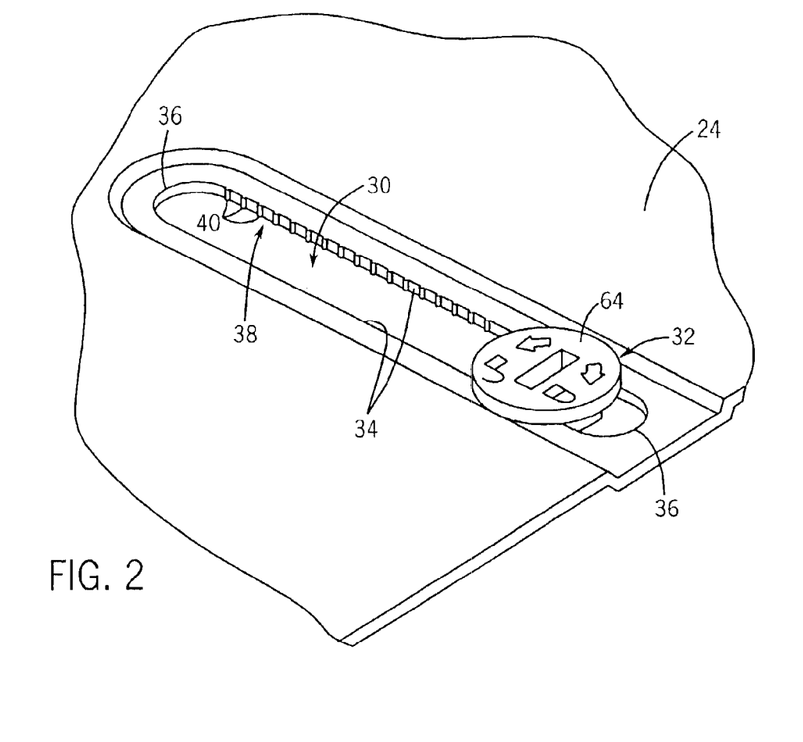
FIG. 2 is an enlarged view of the retention mechanism illustrated in FIG. 1.

In the embodiment illustrated in FIGS. 1 and 2, chassis 22 comprises a sub-chassis, however chassis 22 also may comprise the overall chassis of electronic device 20. One exemplary chassis 22 is a computer enclosure, such as a peripheral component interconnect (PCI) cage. In the design illustrated, chassis 22 comprises structural wall 24 and a plurality of other structural walls 25, including a removable door 26. Electronic device 20 also utilizes a retention system 28. Retention system 28 comprises the structural wall 24 in which a slot 30 is formed. System 28 also comprises a retainer, e.g. retainer plug 32, designed for slidable engagement with slot 30. In the embodiment illustrated, retainer plug 32 comprises an end cap 64. Depending on the design layout of electronic device 20, as well as the specific use of retainer plug 32, slot 30 may be formed in structural wall 24 of chassis 22 or in another structural wall.

The exemplary slot 30 is formed through the appropriate structural wall and may be defined by a pair of generally parallel slot edges 34 joined by slot end edges 36. In one embodiment, slot end edges 36 may be arcuate, e.g. semicircular, in form. Additionally, at least one of the slot edges 34 may be combined with a gripping member 38 that facilitates locking of retainer plug 32 at a desired location along slot 30. An exemplary gripping member 38 comprises a plurality of serrations 40 disposed along at least one of the slot edges 34 to create a serrated edge.

Figure 3:
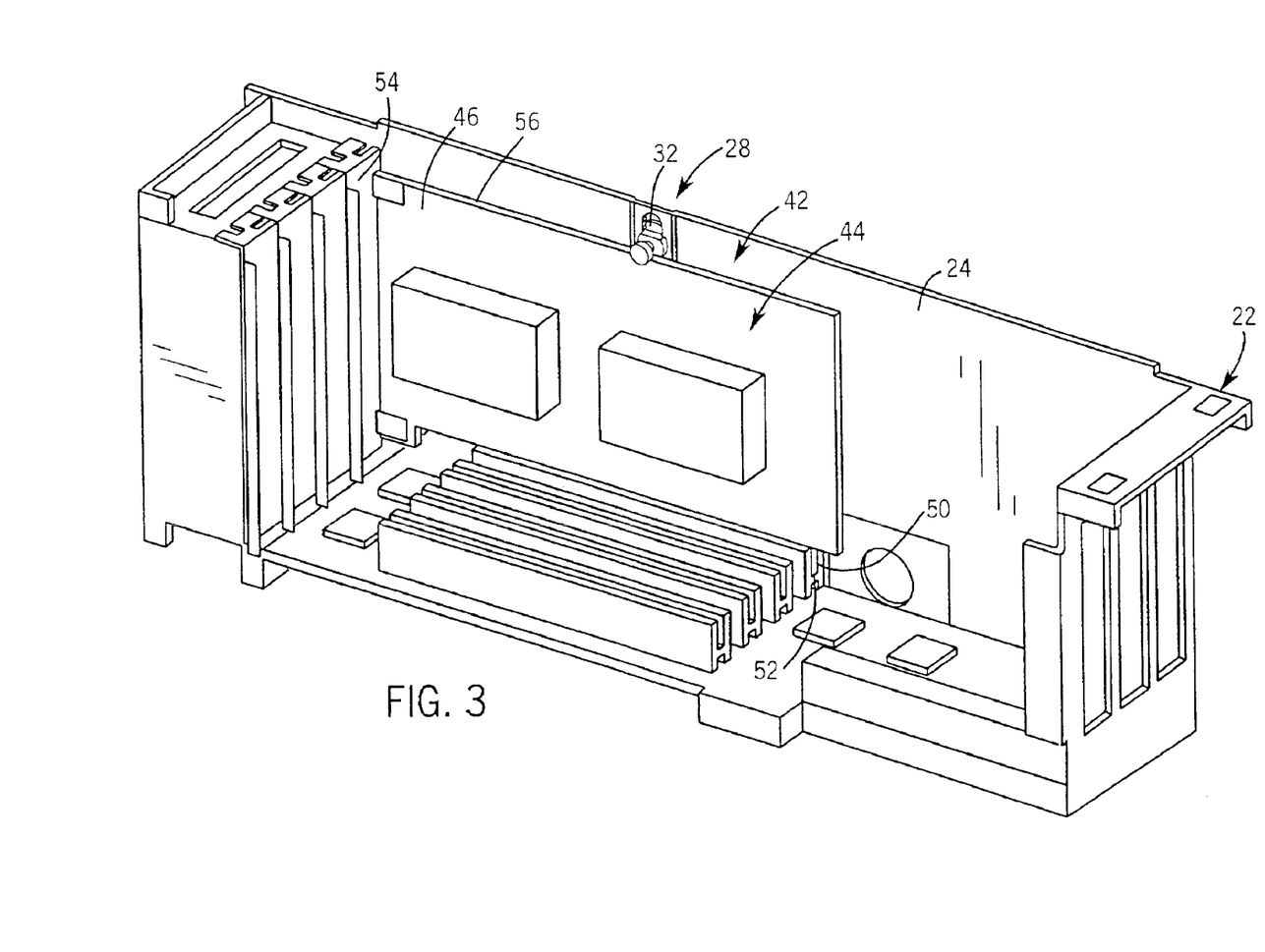
FIG. 3 is a perspective view of one embodiment of a chassis in which an embodiment of a retention mechanism is utilized.

Referring generally to FIG. 3, retainer plug 32 is illustrated adjacent an assembly 42 that is held or retained at a desired location within chassis 22. Assembly 42 is disposed proximate structural wall 24, and retainer plug 32 is moved into a position to impede undesired movement of assembly 42. In the specific example illustrated, assembly 42 comprises a printed circuit card assembly 44 having a printed circuit card 46.

Assembly 42 is held in engagement with a corresponding connector via retainer plug 32. For example, if assembly 42 comprises printed circuit assembly 44, the printed circuit card 46 may be held in engagement with a card edge connector 50 mounted in chassis 22. In this embodiment, printed circuit card assembly 44 comprises an engagement edge 52 configured for insertion into card edge connector 50. Furthermore, printed circuit card assembly 44 may have a slide mechanism 54 disposed along a card edge to engage chassis 22. Printed circuit card 46 also has a retention edge 56 engaged by retainer plug 32. The retention edge 56 may be positioned generally opposite engagement edge 52.

In at least one embodiment of retention system 28, retainer plug 32 is designed to impede movement of printed circuit card 46 in at least two axial directions. For example, retainer plug 32 restricts movement of printed circuit card 46 in a direction generally parallel to structural wall 24 and in a direction transverse to structural wall 24. Thus, retention system 28 is able to impede both inadvertent release of printed circuit card 46 and bending of card 46.

Figure 4:
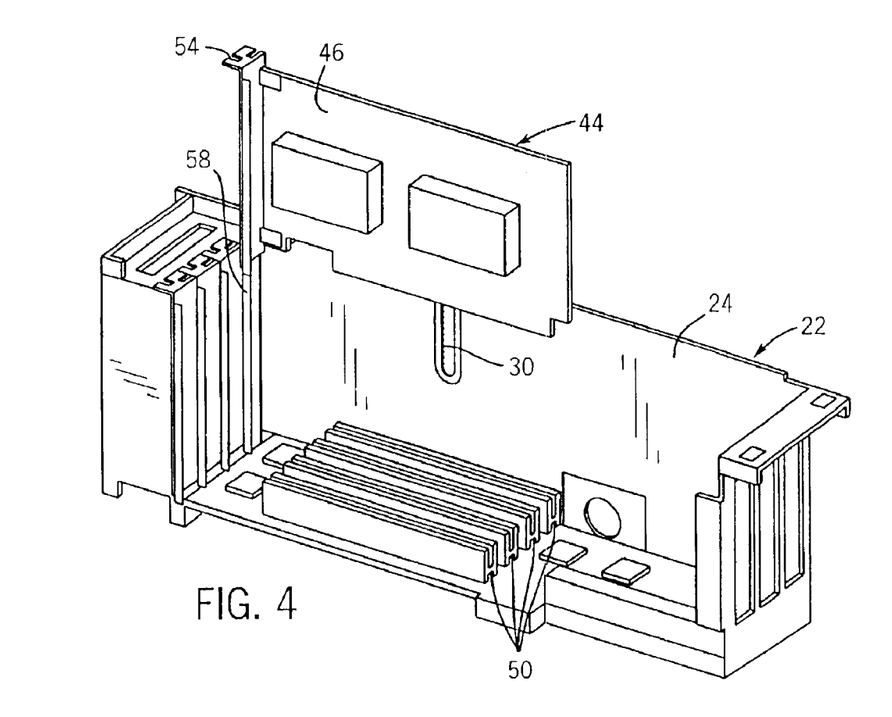
FIG. 4 is a perspective view of a printed circuit card assembly being connected to the chassis illustrated in FIG. 3.
Figure 5:
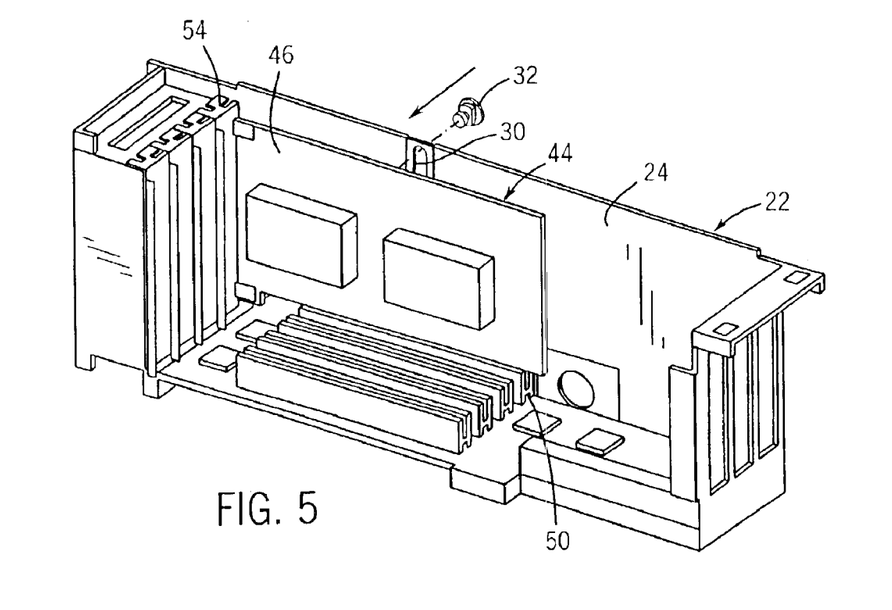
FIG. 5 is a perspective view of the printed circuit card assembly of FIG. 4 coupled to a corresponding connector in the chassis.

With reference to FIGS. 4 through 8, insertion and retention of the exemplary printed circuit card assembly 44 is illustrated. As shown in FIG. 4, printed circuit card 46 is initially generally aligned in parallel with structural wall 24, and slide mechanism 54 is engaged with corresponding slide 58 of chassis 22. Slide mechanism 54 and printed circuit card assembly 44 are then moved into engagement with card edge connector 50 by inserting engagement edge 52 of printed circuit card 46 into card connector 50, as illustrated in FIG. 5.

Figure 6:
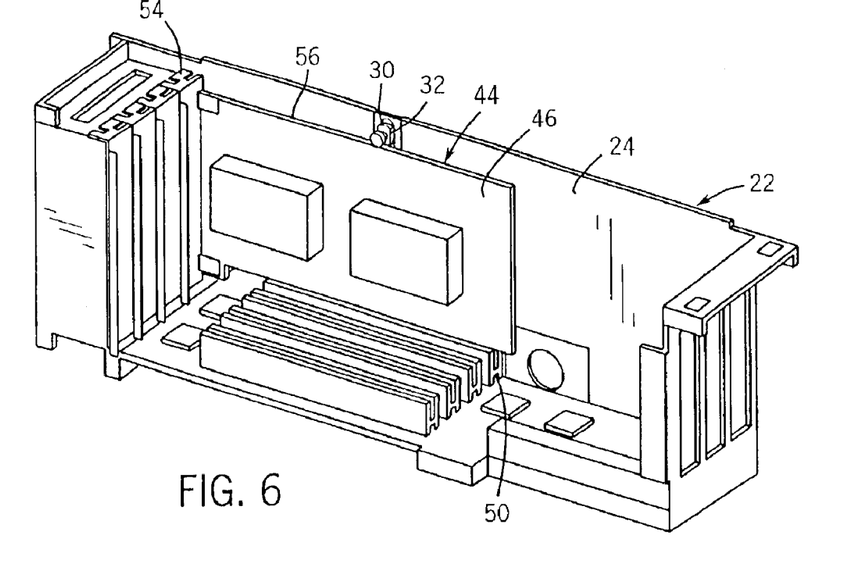
FIG. 6 is a perspective view similar to FIG. 5 showing an embodiment of a retention mechanism inserted into a slot in the chassis.
Figure 7:
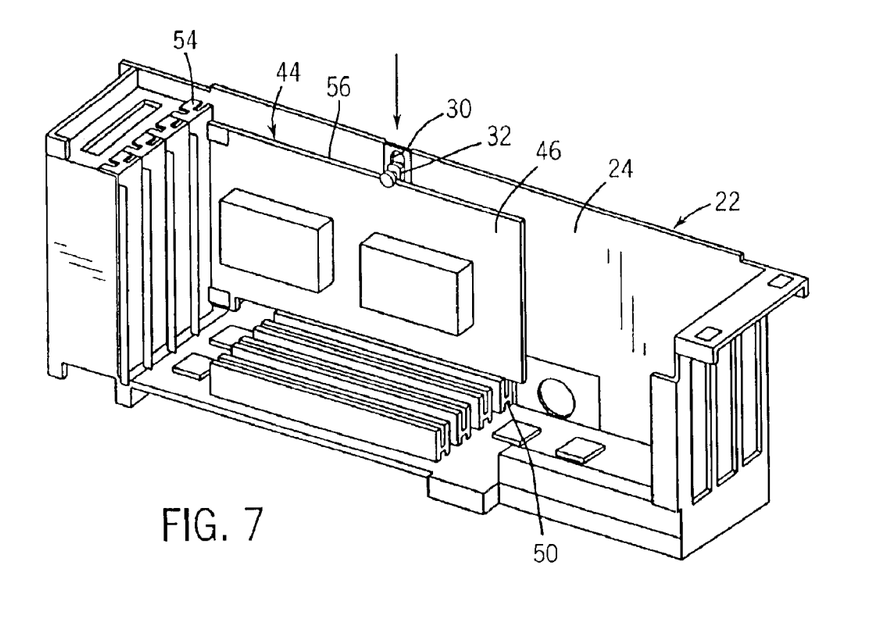
FIG. 7 is a perspective view similar to FIG. 6 illustrating the retention mechanism of FIG. 6 moved into engagement with the printed circuit card assembly.
Figure 8:
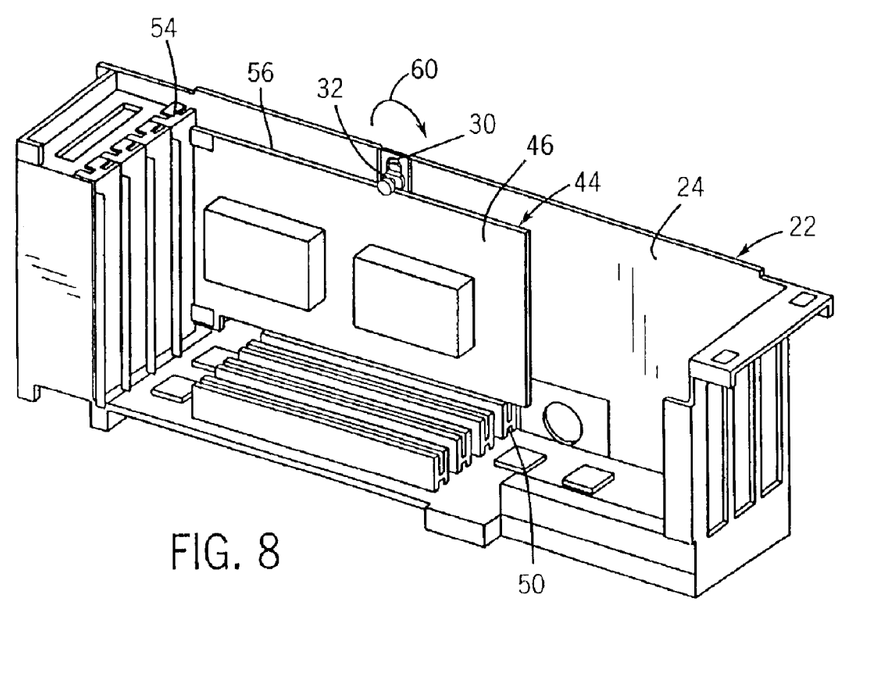
FIG. 8 is a perspective view similar to FIG. 7 illustrating one embodiment of the retention mechanism rotated to a locked position.

Subsequently, retainer plug 32 is preferably inserted into slot 30 from an external side of structural wall 24. Retainer plug 32 extends into the interior of chassis 22 for engagement with printed circuit card assembly 44, as illustrated in FIG. 6. The retainer plug 32 is slid along slot 30 into proximity with retention edge 56 of printed circuit card 46. In one embodiment, the retainer plug 32 is moved into abutting engagement with retention edge 56, as best illustrated in FIG. 7.

Once retainer plug 32 is at a desired location with respect to printed circuit card assembly 44, the retainer plug is actuated in a manner that locks the retainer plug within slot 30 at the desired location, e.g. against retention edge 56. In the embodiment illustrated, the locking of retainer plug 32 at a desired location along slot 30 is accomplished by rotating the retainer plug, as illustrated by arrow 60 in FIG. 8. In this embodiment, the retainer plug is preferably rotated less than 100 degrees, e.g. approximately 90 degrees, to transition the retainer plug from a slidable orientation to a locked orientation.

Figure 9:
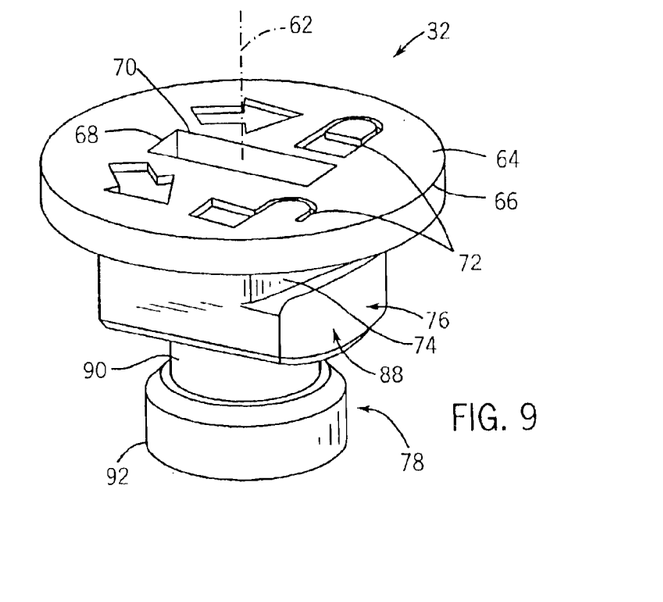
FIG. 9 is a perspective view of an embodiment of a retention mechanism.
Figure 10:
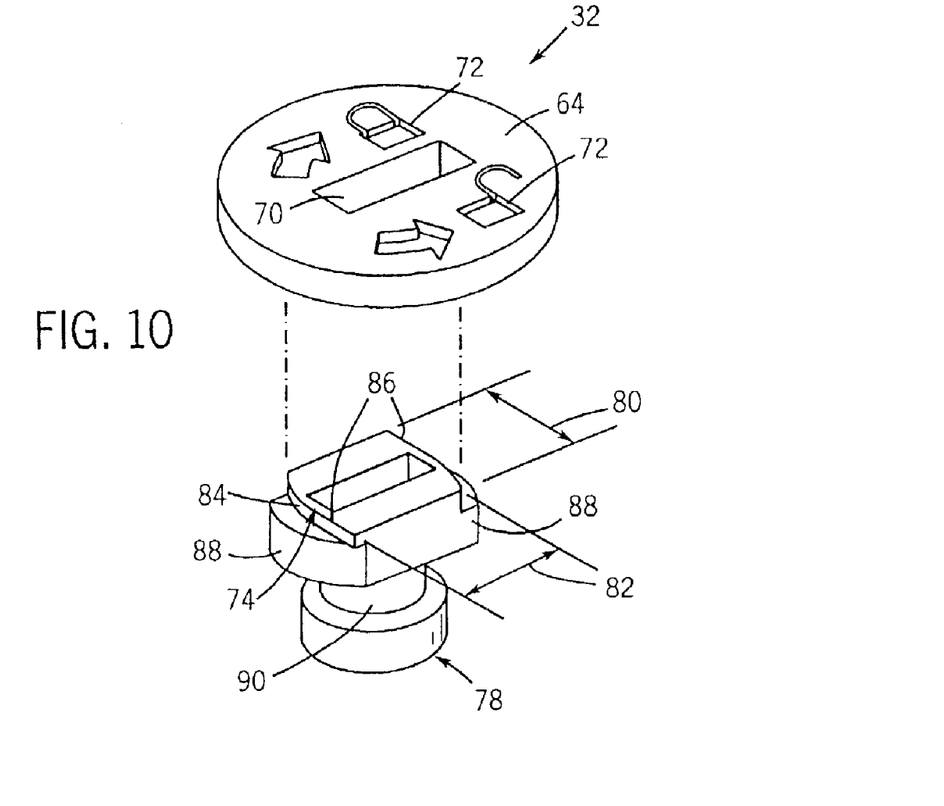
FIG. 10 is an exploded view of the retention mechanism illustrated in FIG. 9.
Figure 11:
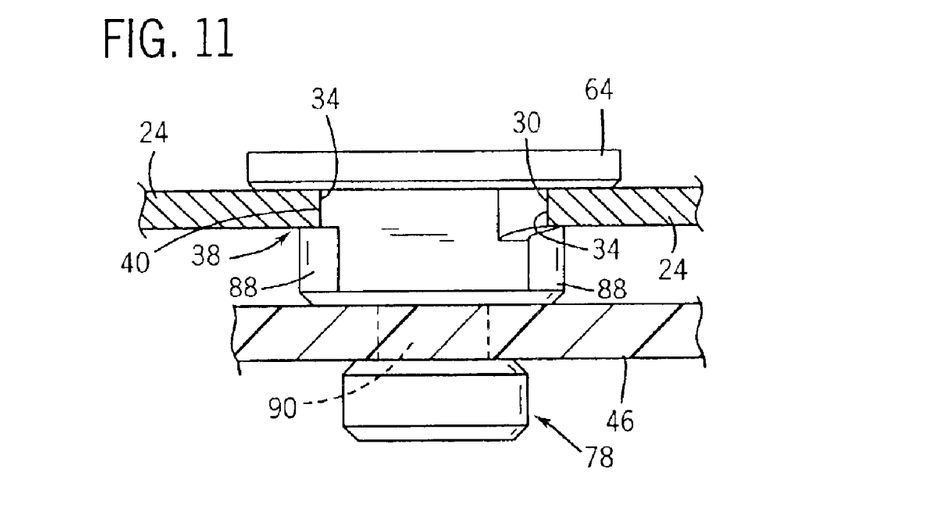
FIG. 11 is a front view of the retention mechanism illustrated in FIG. 9 engaged with a printed circuit card assembly and an adjacent structural wall.

In FIGS. 9 through 11, an embodiment of retainer plug 32 is illustrated in greater detail. The illustrated retainer plug 32 has an axis 62 and a plurality of features disposed along axis 62. For example, retainer plug 32 may comprise end cap 64 having a perimeter 66 that prevents axial movement of retainer plug 32 through slot 30. In other words, the width dimensions of end cap 64 are greater than the width of slot 30 to prevent end cap 64 from passing through slot 30 (see FIGS. 2 and 11). In the embodiment illustrated, end cap 64 has a short axial height to minimize space utilization adjacent structural wall 24.

End cap 64 also may comprise a tool feature 68 that permits a tool to be engaged with retainer plug 32 for actuating the retainer plug between slidable and locked orientations. In the embodiment illustrated, tool feature 68 comprises a slot 70 that may be engaged by a conventional flat-tipped screwdriver. Slot 70 may be formed all the way through end cap 64 and into the interior of retainer plug 32, as illustrated in FIG. 10. End cap 64 also may comprise visible indicia 72. The visible indicia 72 provides an operator with an easy visual indication of the direction of movement, e.g. rotation about axis 62, to actuate retainer plug 32 between a locked position and an unlocked position.

Extending axially from end cap 64, retainer plug 32 comprises a cam region 74, a midsection 76 and an engagement end 78. Cam region 74 is disposed in an axially intermediate position between end cap 64 and midsection 76. Engagement end 78 is disposed on an axially opposite side of midsection 76 from cam region 74.

As illustrated best in the exploded view of FIG. 10, cam region 74 comprises a diametrical dimension 80 that is narrower than the width of slot 30 between slot edges 34. Thus, retainer plug 32 may be slid along the length of slot 30 when oriented with the narrower diametrical dimension 80 between slot edges 34. Cam region 74 also comprises a diametrical dimension 82 that is wider than the width of slot 30 between slot edges 34. Thus, when retainer plug 32 is rotated about its axis 62 from a position in which the diametrical dimension 80 extends across slot 30 to a position in which wider diametrical dimension 82 extends across slot 30, an interference fit is created (see FIG. 11). The interference fit effectively locks retainer plug 32 in that position relative to slot 30. In one embodiment, the narrow diametrical dimension 80 is generally perpendicular to the wider diametrical dimension 82.

The locking of retainer plug 32 is facilitated by a cam surface 84 disposed in cam region 74. Cam surface 84 is positioned to engage gripping member 38, e.g. serrations 40, as retainer plug 32 is rotated from its unlocked to its locked position. Gripping member 38 helps hold cam surface 84 in place as cam region 74 is rotated to an interference fit with slot edges 34 of slot 30. In this embodiment, cam surface 84 is an arcuate surface that facilitates the transition of retainer plug 32 from an orientation in which narrower diametrical dimension 80 extends across slot 30 to an orientation in which wider diametrical dimension 82 extends across slot 30 in an interfering fit. Also in this embodiment, as the cam surface 84 is rotated into contact with gripping member 38, the center of rotation of retainer plug 32 changes and the retainer plug is rolled along slot 30 longitudinally. This motion rolls the retainer plug 32 against the edge of card 46 before locking in place.

Cam region 74 also may comprise at least one flat section 86 to limit rotation of retainer plug 32 as it is moved to a locked position. Flat section 86 holds the retainer plug 32 in the locked position. In the embodiment illustrated, two flat sections 86 are disposed on generally opposite sides of cam region 74 and are positioned to abuttingly engage opposite slot edges 34 when retainer plug 32 is rotated approximately 90 degrees from its unlocked orientation. Depending on the design and application of retainer plug 32, however, the at least one flat section 86 may be located at different positions that require a greater degree or lesser degree of rotation to actuate the retainer plug between an unlocked and a locked position.

Midsection 76 is sized for insertion through slot 30. However, midsection 76 comprises at least one extension 88 that extends radially outward from axis 62. In the embodiment illustrated, midsection 76 comprises two radial extensions 88 that extend radially outward beyond wider diametrical dimension 82. Thus, as retainer plug 32 is rotated from its unlocked or slidable position to a locked position, structural wall 24 is trapped between end cap 64 and extensions 88. In this position, axial movement of retainer plug 32 is restricted.

The configuration of engagement end 78 may vary depending on the size and configuration of assembly 42. In the exemplary embodiment illustrated, however, engagement end 78 comprises a groove 90 disposed between midsection 76 and a distal portion 92 of engagement end 78. Groove 90 is sized to receive retention edge 56 of printed circuit card 46. Therefore, when retainer plug 32 is moved into engagement with printed circuit card 46, retention edge 56 is disposed within groove 90 and movement of printed circuit card 46 is restrained along at least two linear axes.

Specifically, movement of printed circuit card 46 in a direction generally parallel with structural wall 24 as well as in a direction generally transverse to structural wall 24 is restrained. In the event printed circuit card assembly 44 is to be removed, retainer plug 32 is rotated to an unlocked orientation and preferably removed from slot 30. Removal of plug 32 permits disengagement of printed circuit card assembly 44 from card edge connector 50 and removal of the assembly.

It will be understood that the foregoing description is of exemplary embodiments of the invention, and that the invention is not limited to the specific forms shown. For example, the retainer may be utilized with a variety of electrical devices and chassis types; the retainer may be used to retain numerous types of assemblies along a given structural wall; the size, shape and features of the retainer may be adjusted; and the movement required for actuation between unlocked and locked positions may be altered from that described above.

What is claimed is:

1. A retention system for a printed circuit assembly, comprising:
    a structural wall having a wall edge that defines a slot;
    a printed circuit card disposed proximate the slot; and
    a threadless retainer plug slidably disposed in the slot, such that rotation of the threadless retainer plug locks the threadless retainer plug at a desired location along the slot to limit movement of the printed circuit card.

2. The retention system as recited in claim 1, wherein the threadless retainer plug comprises an edge groove sized to receive a card edge of the printed circuit card.

3. The retention system as recited in claim 1, wherein the threadless retainer plug has a cam region with a narrow diametrical dimension less than the width of the slot and a wide diametrical dimension greater than the width of the slot.

4. The retention system as recited in claim 1, wherein the threadless retainer plug further comprises a cam surface positioned to engage the wall edge and force the threadless retainer plug into an interference fit within the slot as the threadless retainer plug is rotated to a locked position.

5. The retention system as recited in claim 1, further comprising a card edge connector, the printed circuit card being held in engagement with the card edge connector by the threadless retainer plug when the threadless retainer plug is rotated to a locked position.

6. The retention system as recited in claim 1, wherein the threadless retainer plug comprises a cam region proximate the wall edge.

7. The retention system as recited in claim 1, wherein the threadless retainer plug is abutted against the printed circuit card at the desired location.

8. The retention system as recited in claim 1, wherein the printed circuit card is oriented substantially parallel to the structural wall.

9. The retention system as recited in claim 1, wherein the threadless retainer plug has a low profile configured to minimize space consumption adjacent the structural wall.

10. The retention system as recited in claim 1, wherein the threadless retainer plug comprises visible indicia of a locked position or an unlocked position, or a combination of locked and unlocked positions.

11. The retention system as recited in claim 1, wherein the threadless retainer plug comprises a locked position and an unlocked position, the locked and locked positions being separated by less than one rotation of the threadless retainer plug in the slot.

12. A system, comprising:
    a computer having a wall and a card edge connector adjacent the wall;
    a printed circuit card coupled to the card edge connector; and
    a threadless retainer slidably mounted for movement along the wall, wherein the threadless retainer may be slid into engagement with the printed circuit card and selectively locked to retain the printed circuit card in engagement with the card edge connector.

13. The system as recited in claim 12, wherein the threadless retainer is slidably mounted in a slot formed through the wall.

14. The system as recited in claim 12, wherein the wall is part of a peripheral component interconnect cage.

15. The system as recited in claim 12, wherein the threadless retainer comprises a cam region having a cam surface positioned to act against an edge of the slot as the threadless retainer is rotated about a retainer axis.

16. The system as recited in claim 12, wherein the threadless retainer comprises at least one flat section to hold the threadless retainer in a locked position.

17. The system as recited in claim 12, wherein the threadless retainer has a low profile configured to minimize space consumption adjacent the wall.

18. The system as recited in claim 12, wherein the threadless retainer comprises visible indicia of a locked position or an unlocked position, or a combination of locked and unlocked positions.

19. The system as recited in claim 12, wherein the threadless retainer comprises a locked position and an unlocked position relative to the wall, the locked and locked positions being separated by less than one rotation of the threadless retainer.

20. A device for use in securing an assembly within an electronic device, comprising:
    a retainer having an axis, the retainer further having:
    an end cap;
    a midsection with at least one radial extension;
    a cam region disposed intermediate the end cap and the midsection, the cam region being sized to lock the retainer at a position along a slot; and
    an assembly engagement end disposed on an axially opposite side of the midsection from the cam region.

21. The device as recited in claim 20, wherein the cam region comprises a narrow diametrical dimension and a wider diametrical dimension generally perpendicular to the narrow diametrical dimension.

22. The device as recited in claim 20, wherein the cam region comprises at least one flat section.

23. The device as recited in claim 20, wherein the assembly engagement end comprises a groove to receive a portion of the assembly and impede movement of the assembly in an axial direction.

24. The device as recited in claim 20, wherein the end cap comprises a visible indicia of directional movement for actuating the retainer between a locked and an unlocked position.

25. A method of retaining at least one printed circuit assembly within a chassis, comprising:
deploying a retainer plug in a wall slot adjacent a printed circuit card;
moving the retainer plug along the wall slot until it is proximate an edge of the printed circuit card; and
creating an interference fit, without a threaded fastener, between the retainer plug and a pair of edges defining the wall slot.

26. The method as recited in claim 25, wherein creating comprises rotating the retainer plug about an axis to drive a cam surface against at least one of the pair of edges.

27. The method as recited in claim 26, wherein rotating comprises rotating the retainer plug ninety degrees.

28. The method as recited in claim 26, wherein rotating comprises rotating the retainer plug until a flat section of the retainer plug abuts at least one edge of the pair of edges.

29. The method as recited in claim 25, wherein moving comprises capturing the edge of a printed circuit card in a groove formed in the retainer plug to impede removal of the printed circuit card.

30. The method as recited in claim 25, wherein moving comprises capturing the edge of a printed circuit card in a groove formed in the retainer plug to impede flexing of the printed circuit card.

31. The method as recited in claim 25, wherein moving the retainer plug comprises abutting the retainer plug against the printed circuit card.

32. The method as recited in claim 25, wherein creating the interference fit comprises turning the retainer plug less than one rotation between an unlocked position and a locked position in the wall slot.

33. A retention system, for a printed circuit assembly, comprising:
a structural wall having a wall edge that defines a slot;
a printed circuit card disposed proximate the slot; and
a retainer plug slidably disposed in the slot, such that rotation of the retainer plug locks the retainer plug to limit movement of the printed circuit card, wherein the structural wall comprises a grip edge to grip the retainer plug as the retainer plug is rotated.

34. The retention system as recited in claim 33, wherein the grip edge comprises a serrated edge.

35. A retention system, for a printed circuit assembly, comprising:
a structural wall having a wall edge that defines a slot;
a printed circuit card disposed proximate the slot; and
a retainer plug slidably disposed in the slot, such that rotation of the retainer plug locks the retainer plug to limit movement of the printed circuit card, wherein the retainer plug comprises at least one flat section to limit the rotation of the retainer plug.

36. A retention system, for a printed circuit assembly, comprising:
a structural wall having a wall edge that defines a slot;
a printed circuit card disposed proximate the slot; and
a retainer dug slidably disposed in the slot, such that rotation of the retainer plug locks the retainer plug to limit movement of the printed circuit card, wherein the rotation of the retainer plug is limited to less than 100 degrees.

37. A system, comprising:
a computer having a wall and a card edge connector adjacent the wall;
a printed circuit card coupled to the card edge connector; and
a retainer slidably mounted for movement alone the wall, wherein the retainer may be slid into engagement with the printed circuit card and selectively locked to retain the printed circuit card in engagement with the card edge connector, wherein the retainer comprises an edge groove sized to receive an edge of the printed circuit card.

38. A system for retaining at least one printed circuit assembly within a chassis, comprising:
means for moving a retainer plug into proximity with a printed circuit card edge; and
means for creating an interference fit, without a threaded fastener, between the retainer plug and a pair of edges formed in a device chassis.

39. The system as recited in claim 38, wherein the means for moving comprises a slot.

40. The system as recited in claim 38, wherein the means for creating comprises a cam surface on the retainer plug.

* * * * *